United States Patent
Casiraghi et al.

(10) Patent No.: US 11,335,492 B2
(45) Date of Patent: May 17, 2022

(54) SOLENOID PLUNGER MOVEMENT DETECTION SYSTEM

(71) Applicant: Maxim Integrated Products, Inc., San Jose, CA (US)

(72) Inventors: Roberto Casiraghi, Milan (IT); Luigi Franchini, Rimini (IT); Pietro Introini, Lacchiarella (IT)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 47 days.

(21) Appl. No.: 16/847,584

(22) Filed: Apr. 13, 2020

(65) Prior Publication Data

US 2020/0328019 A1      Oct. 15, 2020

Related U.S. Application Data

(60) Provisional application No. 62/833,896, filed on Apr. 15, 2019.

(51) Int. Cl.
*H01F 7/18*      (2006.01)

(52) U.S. Cl.
CPC ... *H01F 7/1844* (2013.01); *H01F 2007/1866* (2013.01)

(58) Field of Classification Search
CPC .................. H01F 7/1844; H01F 2007/1866
USPC ........................................................ 361/160
See application file for complete search history.

(56) References Cited

U.S. PATENT DOCUMENTS

| | | | |
|---|---|---|---|
| 3,988,664 A * | 10/1976 | Beery | G06K 13/04 324/423 |
| 5,442,671 A | 8/1995 | Wollschlager et al. | |
| 5,784,245 A | 7/1998 | Moraghan et al. | |
| 5,808,471 A | 9/1998 | Rooke et al. | |
| 6,322,166 B1 * | 11/2001 | Furuya | B60T 8/36 251/129.05 |
| 2007/0291438 A1 * | 12/2007 | Ahrens | F16K 31/06 361/160 |
| 2016/0125993 A1 | 5/2016 | Narayanasamy et al. | |
| 2019/0235010 A1 * | 8/2019 | Narayanasamy | G01D 5/2006 |

* cited by examiner

*Primary Examiner* — Kevin J Comber
*Assistant Examiner* — Sreeya Sreevatsa
(74) *Attorney, Agent, or Firm* — Robert Crownover

(57) ABSTRACT

A solenoid plunger movement detection system and method can include: detecting current supplied to a solenoid with a current sensor; converting the current supplied to the solenoid into a digital signal with a counter coupled to a first comparator; detecting a peak within the digital signal with a peak detector; comparing the peak to the digital signal with a second comparator coupled to the peak detector; measuring a dip from the peak and measuring a trough with the second comparator; generating a fault when the peak and the trough indicate a smooth current ramp to the solenoid; receiving configurable parameters for processing the digital signal with a signal processor; and providing configurable parameters to the counter, the second comparator, the signal processor, or a combination thereof with an interface.

18 Claims, 2 Drawing Sheets

SOLENOID PLUNGER MOVEMENT DETECTION SYSTEM

CROSS-REFERENCE TO RELATED APPLICATION(S)

This claims priority benefit to all common subject matter of U.S. Provisional Patent Application No. 62/833,896 filed Apr. 15, 2019. The content of this application, in its entirety, is incorporated herein by reference.

TECHNICAL FIELD

This disclosure relates to electric solenoids, more particularly to detecting movement attributes of electric solenoids.

BACKGROUND

The rapid automation within industries including manufacturing, health care, and automotive relies heavily on the electric solenoid. Electric solenoids can be found in automatic locking mechanisms such as door locks for offices, hotels, and high security areas.

Electronic solenoids are also important in the medical field where precise and accurate motion is required, such as during the operation of dialysis and dosing machines. Industrial manufacturing can require the precise actuation of tens or hundreds of electric solenoids, for example in textile manufacturing systems.

When a solenoid valve does not work properly, generally it is due to the plunger being stuck. When used in industrial manufacturing, the malfunctioning of one electric solenoid can impact the quality of the product, can stop a production line, and even present a risk to an operator. When used in the medical or security industries, the malfunctioning of an electric solenoid can result in the loss of life.

A prompt and affordable detection of this failure is highly desirable. Movement detection mechanisms for electric solenoids have unique attributes that have significant impacts on manufacturing integration, in that they must be generally small, lightweight, and rich in functionality and they must be produced in high volumes at relatively low cost.

As an extension of the electronics industry, the electronic solenoid industry has witnessed ever-increasing commercial competitive pressures, along with growing consumer expectations and the diminishing opportunities for meaningful product differentiation in the marketplace.

Electronic detection of solenoid motion attributes is at the very core of next generation electronics insertion strategies outlined in road maps for development of next generation products. Beyond the performance requirements of next generation devices, the industry now demands that cost be a primary product differentiator in an attempt to meet profit goals.

There have been previous approaches to addressing the requirements of control and detection of solenoid motion attributes. Industry road maps have identified significant gaps between the current capability and the available supporting electronic detection technologies.

One such previous approach to detecting solenoid motion attributes relies on op-amps, comparators, and active peak detectors. However, this approach is expensive, consumes large amounts of power, and is not easily configurable.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce power requirements, provide configurability, and meet competitive pressures, adds an even greater urgency to the critical necessity for finding answers to these problems.

Thus, a need remains for accurate, low cost, highly configurable, control and detection of solenoid motion attributes, with significantly lower power requirements. Solutions to these problems have been long sought but prior developments have not taught or suggested any solutions and, thus, solutions to these problems have long eluded those skilled in the art.

BRIEF DESCRIPTION OF THE DRAWINGS

The detection system is illustrated in the figures of the accompanying drawings which are meant to be exemplary and not limiting, in which like reference numerals are intended to refer to like components, and in which.

DETAILED DESCRIPTION

Figure 1:
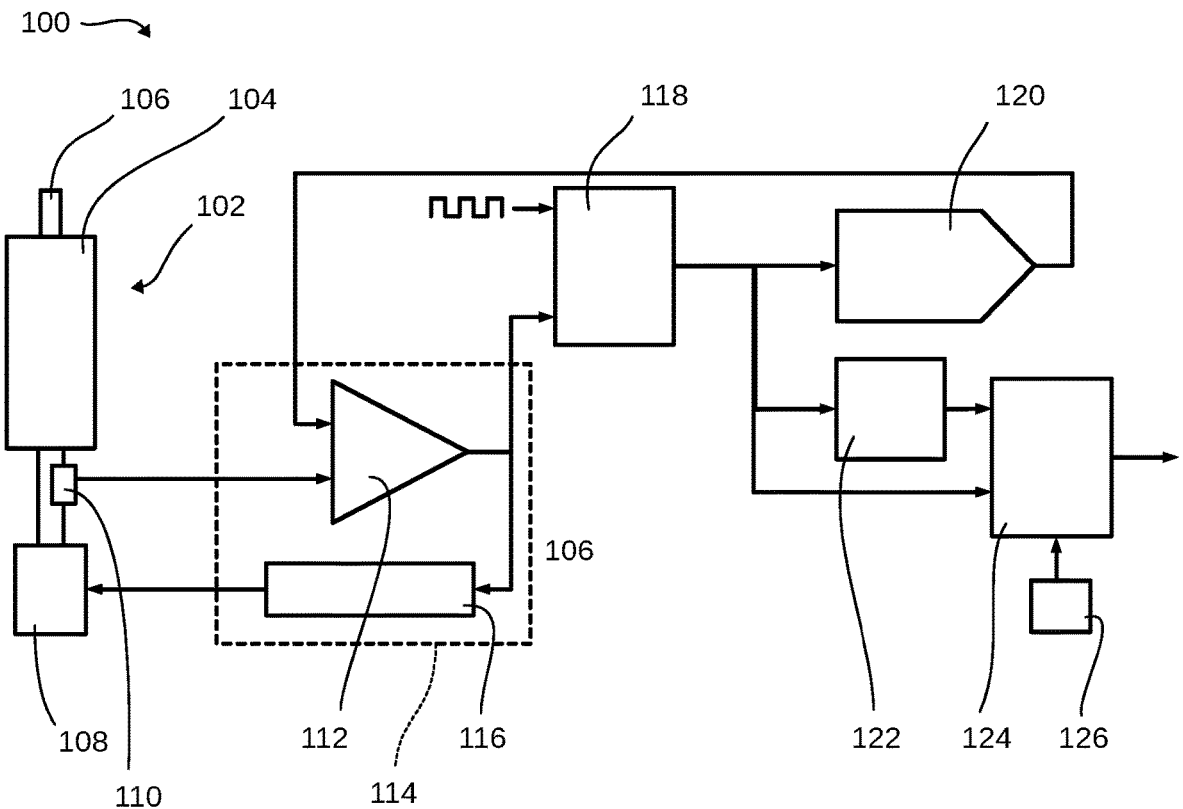
FIG. 1 is a block diagram of the detection system 100 in a first embodiment.

In the following description, reference is made to the accompanying drawings that form a part hereof, and in which are shown by way of illustration, embodiments in which the detection system may be practiced. It is to be understood that other embodiments may be utilized and structural changes may be made without departing from the scope of the detection system.

When features, aspects, or embodiments of the detection system are described in terms of steps of a process, an operation, a control flow, or a flow chart, it is to be understood that the steps can be combined, performed in a different order, deleted, or include additional steps without departing from the detection system as described herein.

The detection system is described in sufficient detail to enable those skilled in the art to make and use the detection system and provide numerous specific details to give a thorough understanding of the detection system; however, it will be apparent that the detection system may be practiced without these specific details.

In order to avoid obscuring the detection system, some well-known system configurations and descriptions are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Generally, the detection system can be operated in any orientation. As used herein, the term "coupling" or "coupled" means an electrical connection between components. The term "system" means a machine or apparatus.

Referring now to FIG. 1, therein is shown a block diagram of the detection system 100 in a first embodiment. The detection system 100 can include a solenoid 102.

The solenoid 102 is depicted as a single solenoid, however it is to be understood that the solenoid 102 is representative of one or many solenoids. The solenoid 102 can, for example, be a linear solenoid also known as the linear electromechanical actuator. The solenoid 102 can be comprised of an electrical coil wound around a cylindrical tube within a solenoid body 104 and a magnetic actuator or plunger 106.

The plunger 106 can be free to move or slide in and out of the body 104 of the solenoid 102. When an electrical current is passed through the coils within the body 104 of the solenoid 102, the coils behave like an electromagnet and the plunger 106, which is located inside the coil, is attracted towards the center of the coil by the magnetic flux setup within the coils.

As the plunger 106 moves toward the center of the body 104, the plunger 106 can compress a small spring within the body 104 of the solenoid 102 and attached to one end of the plunger 106. The force and speed of the plunger's 106 movement is determined by the strength of the magnetic flux generated within the coil.

When the supply current is turned off, the electromagnetic field created by the coil will collapse releasing the plunger 106 and allowing the compressed spring to force the plunger 106 back out to its original rest position. The solenoid 102 can be coupled to a power supply 108.

The power supply 108 can supply the current required to actuate the plunger 106 in and out of the body 104 of the solenoid 102. Between the solenoid 102 and the power supply 108, the detection system 100 can include a current sensor 110.

Figure 2:
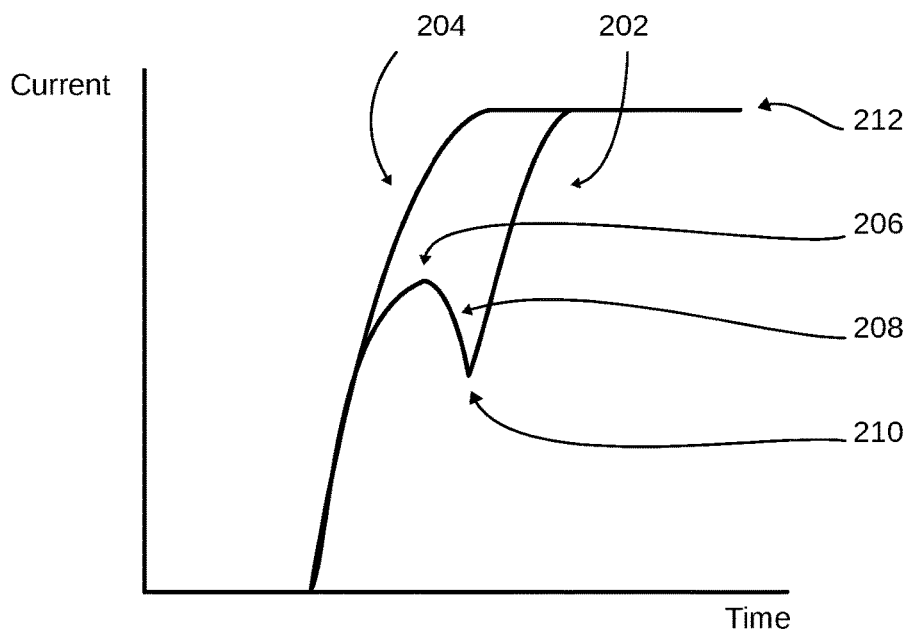
FIG. 2 is a graphical depiction of the current flow detected by the current sensor of FIG. 1.

The current sensor 110 can detect and output the current supplied to the solenoid 102 as represented in FIG. 2. The current sensor 110 can detect the amount of current supplied from the power supply 108 to the solenoid 102. The current sensor 110 can indicate the current detected, as an analog output value. The output of the current sensor 110 can be coupled to a current comparator 112.

The current comparator 112 can, for example, be a component within a current drive regulation loop 114. The current drive regulation loop 114 can ensure a controlled amount of current is supplied to the solenoid 102.

The current drive regulation loop 114 can include regulation components 116 including passive components like resistors, capacitors, and inductors as well as active components such as transistors. The output of the current drive regulation loop 114 can be supplied to the power supply 108.

It has been discovered that utilizing the same current comparator 112 as a component of the current drive regulation loop 114 as well as a component of the detection system 100 reduces part count, reduces footprint, reduces design complexity and critically, reduces cost.

The current comparator 112, together with an up/down counter 118 and a digital to analog converter or a current digital-to-analog converter (DAC) 120, can track the current detected by the current sensor 110. The up/down counter 118 coupled to the current comparator 112 and coupled to the current DAC 120 can operate to convert the current supplied to the solenoid into a digital signal. Illustratively, for example, the current comparator 112 can include two analog inputs, one input from the current sensor 110 and the other input from the current DAC 120.

The output of the current comparator 112 can be a digital signal indicating whether the most recently detected current from the current sensor 110 is above or below a current previously detected, being provided by the output of the current DAC 120. The output of the current comparator 112 can be supplied to the up/down counter 118.

The up/down counter 118 can produce and supply a digital representation of the current detected by the current sensor 110 by counting up or down based on the output supplied by the current comparator 112. The current DAC 120 can then convert the digital representation of the current, supplied by the up/down counter 118, into an analog representation of the current.

The analog representation of the current from the current DAC 120 can then be supplied to the current comparator 112 for comparison with the most recently detected current from the current sensor 110. The digital signal output from the up/down counter 118 can be supplied to both a digital peak detector 122 and a digital comparator 124.

The digital peak detector 122 can include registers to hold and supply the largest digital output from the up/down counter 118 detected within the current solenoid 102 cycle. The largest digital output from the up/down counter 118 can correspond to the peak 206 of FIG. 2.

The up/down counter 118 can supply a subsequent digital representation of the current to the digital comparator 124. For example, the subsequent digital representation of the current can be one or many clock cycles after the digital peak detector 122 latches onto the peak 206.

The digital comparator 124 can therefore compare the peak 206 with the digital output from the up/down counter 118 later in time. This comparison by the digital comparator 124 can measure the difference between the peak 206 and subsequent digital outputs from the up/down counter 118.

Illustratively, for example, this difference can be the difference between the peak 206 and trough 210 of FIG. 2. The digital comparator 124 can include a dip amplitude threshold 126.

The dip amplitude threshold 126 can be a threshold of the difference between the peak 206 and the trough 210. If the difference between the peak 206 and the trough 210, as determined by the digital comparator 124, is larger than the dip amplitude threshold 126, then proper motion of the plunger 106 is detected.

When the difference between the peak 206 and the trough 210, as determined by the digital comparator 124, is smaller than the dip amplitude threshold 126, then proper motion of the plunger 106 is not detected and a fault is generated. The digital comparator 124 can output a fault when the difference between the peak 206 and the trough 210 is smaller than the dip amplitude threshold 126. At the extreme, when the difference between the peak 206 and the trough 210 is small, the peak 206 and the trough 210 will be smooth—as is shown in the improper current ramp-up profile 204—and which indicates a smooth, and improper, current ramp to the solenoid 104.

It has been discovered that determining and processing the peak 206, dip 208, and trough 210 in the digital domain offers decreased power consumption, lower cost, and better configurability over detection of motion in the analog domain, which suffer of low configurability, high power dissipation, and high cost. It has further been discovered that faults detected reported by the detection system 100 can provide a prompt and affordable detection of improper plunger 106 motion, which is highly desirable in many industries including manufacturing industries, health care industries, and automotive industries.

Referring now to FIG. 2, therein is shown a graphical depiction of the current flow detected by the current sensor 110 of FIG. 1. The current sensor 110 can detect the current ramp up of electric current provided to the solenoid 102 of FIG. 1.

For illustrative purposes, the current detected by the current sensor 110 can be depicted as a proper current ramp-up profile 202 and an improper current ramp-up profile 204. The proper current ramp-up profile 202 can result from the plunger 106 of FIG. 1 moving within the solenoid 102.

That is, the proper current ramp-up profile 202 can be indicative of a well-functioning solenoid 102. The proper current ramp-up profile 202 can include a peak 206 and a dip 208.

The dip 208, which gives rise to the presence of the peak 206, can be caused by the instantaneous back electromotive forces (BEMF) generated by the movement of the plunger 106 inside the solenoid 102. The improper current ramp-up profile 204 is shown as smooth having the dip 208 and the peak 206 smoothed out within the improper current ramp-up profile 204. This smoothed current ramp indicates that the plunger 106 is not moving within the solenoid 102.

The peak 206 of the proper current ramp-up profile 202 can indicate when the motion of the plunger 106 begins. The plunger 106 will continue to move through the dip 208, which can end in a trough 210.

The trough 210 can indicate when the plunger 106 has completed its motion. Once the plunger 106 has completed its motion the proper current ramp-up profile 202 can continue to ramp up to a maximum current 212.

Figure 3:
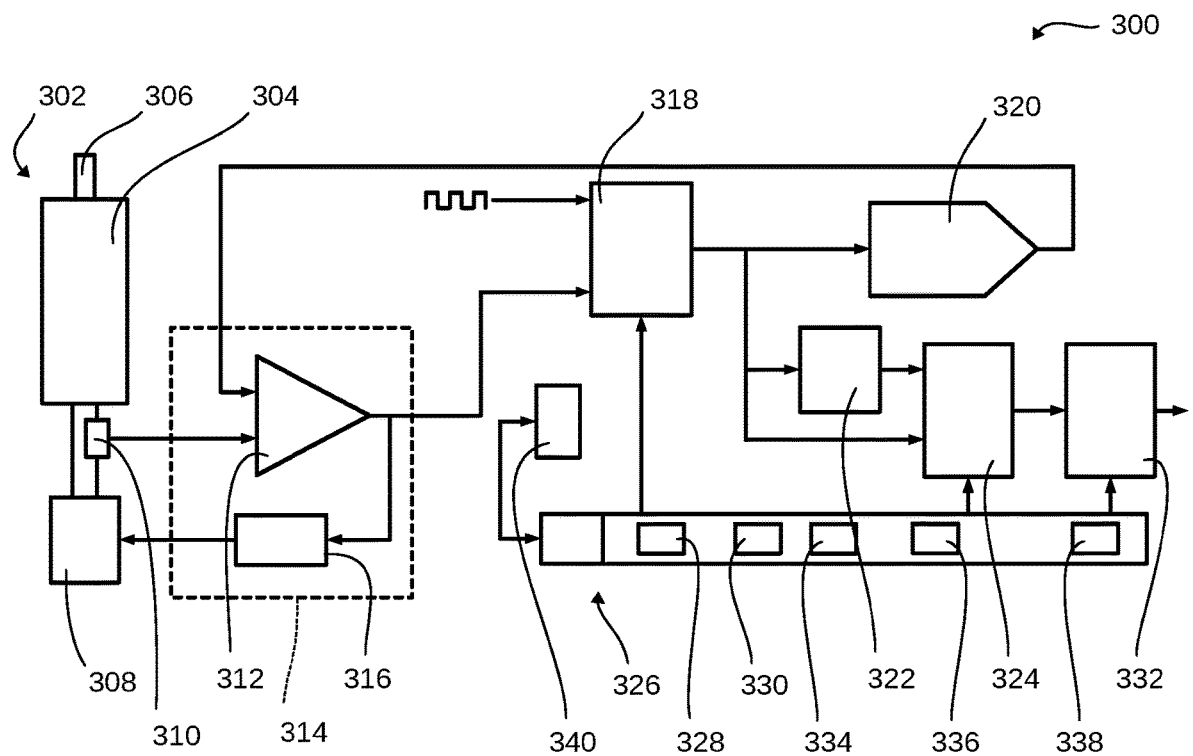
FIG. 3 is a block diagram of a detection system 300 in a second embodiment.

Referring now to FIG. 3, therein is shown a block diagram of a detection system 300 in a second embodiment. The detection system 300 can include a solenoid 302.

The solenoid 302 is depicted as a single solenoid, however it is to be understood that the solenoid 302 is representative of one or many solenoids. The solenoid 302 can, for example, be a linear solenoid also known as the linear electromechanical actuator.

The solenoid 302 can be comprised of an electrical coil wound around a cylindrical tube within a solenoid body 304 and a magnetic actuator or plunger 306.

The plunger 306 can be free to move or slide in and out of the body 304 of the solenoid 302. When an electrical current is passed through the coils within the body 304 of the solenoid 302, the coils behave like an electromagnet and the plunger 306, which is located inside the coil, is attracted towards the center of the coil by the magnetic flux setup within the coils.

As the plunger 306 moves toward the center of the body 304, the plunger 306 can compress a small spring within the body 304 of the solenoid 302 and attached to one end of the plunger 306. The force and speed of the plunger's 306 movement is determined by the strength of the magnetic flux generated within the coil.

When the supply current is turned off, the electromagnetic field created by the coil will collapse releasing the plunger 306 and allowing the compressed spring to force the plunger 306 back out to its original rest position. The solenoid 302 can be coupled to a power supply 308.

The power supply 308 can supply the current required to actuate the plunger 306 in and out of the body 304 of the solenoid 302. Between the solenoid 302 and the power supply 308, the detection system 300 can include a current sensor 310.

The current sensor 310 can detect and output the current supplied to the solenoid 302 as represented in FIG. 2. The current sensor 310 can detect the amount of current supplied from the power supply 308 to the solenoid 302. The current sensor 310 can indicate the current detected, as an analog output value. The output of the current sensor 310 can be coupled to a current comparator 312.

The current comparator 312 can, for example, be part of a current drive regulation loop 314. The current drive regulation loop 314 can ensure a controlled amount of current is supplied to the solenoid 302.

The current drive regulation loop 314 can include regulation components 316 including passive components like resistors, capacitors, and inductors as well as active components such as transistors. The output of the current drive regulation loop 314 can be supplied to the power supply 308.

It has been discovered that utilizing the same current comparator 312 as a component of the current drive regulation loop 314 as well as a component of the detection system 300 reduces part count, reduces footprint, reduces design complexity and critically, reduces cost.

The current comparator 312, together with an up/down counter 318 and a digital to analog converter or a current DAC 320, can track the current detected by the current sensor 310. Illustratively, for example, the current comparator 312 can include two analog inputs, one input from the current sensor 310 and the other input from the current DAC 320.

The output of the current comparator 312 can be a digital signal indicating whether the most recently detected current is above or below a current previously detected. The output of the current comparator 312 can be supplied to the up/down counter 318.

The up/down counter 318 can produce and supply a digital representation of the current detected by the current sensor 310 by counting up or down based on the output supplied by the current comparator 312. The current DAC 320 can then convert the digital representation of the current, supplied by the up/down counter 318, into an analog representation of the current.

The analog representation of the current from the current DAC 320 can then be supplied to the current comparator 312 for comparison with the most recently detected current from the current sensor 310. The digital output from the up/down counter 318 can be supplied to both a digital peak detector 322 and a digital comparator 324.

The digital peak detector 322 can include registers to hold and supply the largest digital output from the up/down counter 318 detected within the current solenoid 302 cycle. The largest digital output from the up/down counter 318 can correspond to the peak 206 of FIG. 2.

The up/down counter 318 can supply a subsequent digital representation of the current to the digital comparator 324 for comparison with the peak 206 supplied by the digital peak detector 322. For example, the subsequent digital representation of the current can be one or many clock cycles after the digital peak detector 322 latches onto the peak 206.

The digital comparator 324 can therefore compare the peak 206 with the digital output from the up/down counter 318 later in time. This comparison by the digital comparator 324 can measure the difference between the peak 206 and subsequent digital outputs from the up/down counter 318. Illustratively, for example, this difference can be the difference between the peak 206 and trough 210 of FIG. 2.

It has been discovered that determining the peak 206, dip 208, and trough 210 in the digital domain offers decreased power consumption, lower cost, and better configurability over detection of motion in the analog domain, which suffer of low configurability, high power dissipation, and high cost.

The up/down counter 318 and the digital comparator 324 can have a digital interface 326 coupled thereto. The digital interface 326 can provide an interface, such as a serial peripheral interface for providing user configurable parameters; however, other digital interfaces could be used without departing from the detection system 300 as disclosed.

Illustratively, the digital interface 326 can provide a user configurable start/end threshold 328 for the up/down counter 318. The start/end threshold 328 can be thresholds for the up/down counter 318 for determining when the up/down counter 318 will begin and end its operation as described above. Implementing the start/end threshold 328 within the up/down counter 318 can rely on a clock input to the up/down counter 318, to convert the current supplied to the solenoid into the digital signal only during the time between the start/end threshold.

Furthermore, the start/end threshold 328 can be used to identify improper plunger movement correlating to a solenoid 302 requiring repair or replacement. The digital interface 326 can also supply a programmable dip amplitude threshold 330 to the digital comparator 324.

The dip amplitude threshold 330 can be a threshold of the difference between the peak 206 and the trough 210. If the difference between the peak 206 and the trough 210, as determined by the digital comparator 324, is larger than the dip amplitude threshold 330, then motion of the plunger 306 is detected.

When the difference between the peak 206 and the trough 210, as determined by the digital comparator 324, is smaller than the dip amplitude threshold 330, then motion of the plunger 306 is not detected and a fault is generated. The digital interface 326 can further provide multiple configurable parameters to a digital signal processor 332. As will be appreciated, the digital interface 326 can provide the configurable parameters to the up/down counter 318, the digital comparator 324, the digital signal processor 332, or a combination thereof.

Illustratively, for example, the digital signal processor 332 can provide digital processing for the signal output from the digital comparator 324 or for the digital representation of the current from the up/down counter 318, in another contemplated embodiment. The digital signal processor 332 can be a specialized microprocessor with its architecture optimized for the operational requirements of digital signal processing, which include continuous processing of the signal from the digital comparator 324; and for which a general purpose processor is insufficient to continuously process this signal in real-time. The digital signal processor 332 together with the up/down counter 318, the digital peak detector 322, and the digital comparator 324, for example, can be implemented with resistor-transistor logic (RTL) or combinational logic.

RTL circuits can be built with resistors and bipolar junction transistors. Combinational logic can perform Boolean operations on the input signals to the digital signal processor 332. It is further contemplated, for example, that the digital signal processor 332, the up/down counter 318, the digital peak detector 322, and the digital comparator 324, can be implemented on a Field-Programmable Gate Array (FPGA), or on an application-specific integrated circuit (ASIC).

Illustratively, the digital signal processor 332 can provide search filters for narrowing the range of current within which the peak 206 and trough 210 can be detected. Filters for narrowing the range of current can be configured using the digital interface 326 to set top and bottom search levels 334, for example.

The digital signal processor 332 can further provide programmable timing parameters. The timing parameters can include de-glitch timings 336 for eliminating noisy portions of the solenoid 302 cycle that are not indicative of electrically powered plunger motion.

The digital signal processor 332 can yet further provide other user configurable signal processing filter parameters. The signal processing filter parameters can include slope profiles 338, for example.

The slope profiles 338 can be the expected slopes before, during, and after the dip 208 of FIG. 2. The digital signal processor 332 can compare the slopes before, during, and after the dip 208 from the up/down counter 318 with the slope profiles 338.

If the slopes before, during, and after the dip 208 from the measured current of the up/down counter 318 deviates from the slope profiles 338 by more than a slope threshold, a fault can be generated. The slope thresholds can also be provided as a user configurable parameter using the digital interface 326.

The digital interface 326 can further be coupled to a memory 340. The memory 340 can be comprised of registers or static random-access memory (SRAM), for example.

The memory 340 can store the measured parameters of the solenoid 102, such as the dip amplitude, the amount of time between supplying the current and the peak 206, and slopes before, during, and after the dip 208.

The digital interface 326 can provide previous measurements from the solenoid 102 from the memory 340 to the digital signal processor 332. The digital signal processor 332 can compare previous measurements from the solenoid 102 with current measurements of the solenoid 102 in order to determine the aging of the solenoid 102.

It is contemplated that the memory 340 can further include thresholds provided to the digital signal processor 332 for determining whether the difference between the previous measurements and the current measurements of the solenoid 102 are large enough to be considered a fault. It has been discovered that comparing the current measurements with previous measurements can measure the change in the solenoid 102 as the solenoid 102 ages and enable the replacement or maintenance of the solenoid 102.

It has been discovered that faults detected reported by the detection system 300 can provide a prompt and affordable detection of improper plunger 306 motion, which is highly desirable in many industries including manufacturing industries, health care industries, and automotive industries.

Figure 4:
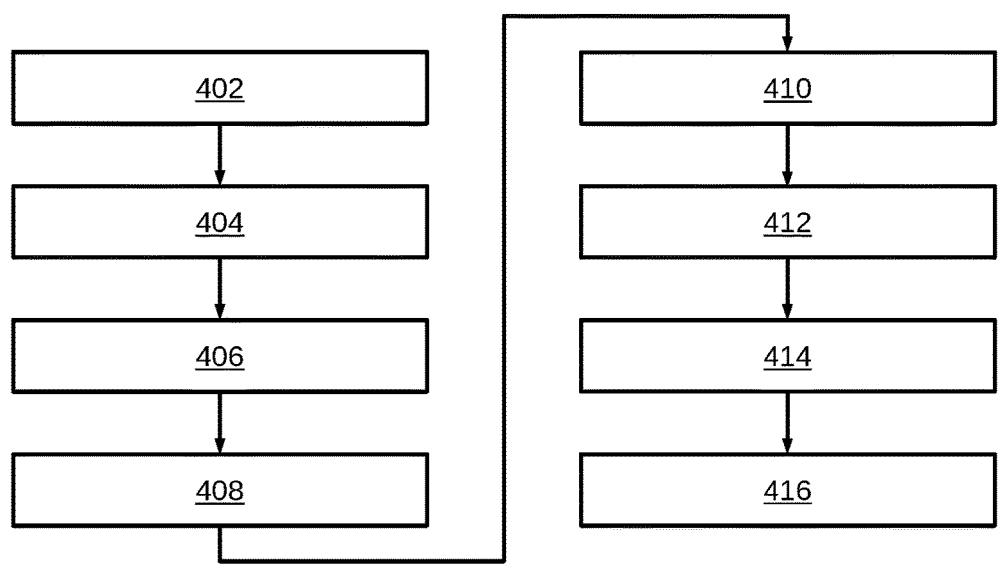
FIG. 4 is a control flow for detecting solenoid plunger movement with the detection system.

Referring now to FIG. 4, therein is shown a control flow for detecting solenoid plunger movement with the detection system including: detecting current supplied to a solenoid with a current sensor in a block 402; converting the current supplied to the solenoid into a digital signal with a counter coupled to a first comparator in a block 404; detecting a peak within the digital signal with a peak detector in a block 406; comparing the peak to the digital signal with a second comparator coupled to the peak detector in a block 408; measuring a dip from the peak and measuring a trough with the second comparator in a block 410; generating a fault when the peak and the trough indicate a smooth current ramp to the solenoid in a block 412; receiving configurable parameters for processing the digital signal with a signal processor in a block 414; and providing configurable parameters to the counter, the second comparator, the signal processor, or a combination thereof with an interface in a block 416.

Thus, it has been discovered that the detection system furnishes important and heretofore unknown and unavailable solutions, capabilities, and functional aspects. The resulting configurations are straightforward, cost-effective, uncomplicated, highly versatile, accurate, sensitive, and effective, and can be implemented by adapting known components for ready, efficient, and economical manufacturing, application, and utilization.

While the detection system has been described in conjunction with a specific best mode, it is to be understood that many alternatives, modifications, and variations will be apparent to those skilled in the art in light of the preceding description. Accordingly, it is intended to embrace all such alternatives, modifications, and variations, which fall within the scope of the included claims. All matters set forth herein or shown in the accompanying drawings are to be interpreted in an illustrative and non-limiting sense.

What is claimed is:

1. A method of detecting solenoid plunger movement comprising:
    detecting current supplied to a solenoid with a current sensor;
    converting the current supplied to the solenoid into a digital signal with a counter;
    detecting a peak within the digital signal with a peak detector;
    comparing the peak to the digital signal with a comparator coupled to the peak detector;
    measuring a dip from the peak and measuring a trough with the comparator;
    generating a fault when the peak and the trough indicate a smooth current ramp to the solenoid; and
    controlling the current to the solenoid with a second comparator functioning as a component within a current drive regulation loop.

2. The method of claim 1 wherein generating the fault includes generating the fault based on a difference between the peak and the trough being smaller than a dip amplitude threshold.

3. The method of claim 1 further comprising determining a difference between a previous measurement from the solenoid and a current measurement of the solenoid with a signal processor coupled to the counter.

4. The method of claim 1 wherein detecting the peak includes detecting the peak from a back electromagnetic force generated by movement of a plunger.

5. A method of detecting solenoid plunger movement comprising:
    detecting current supplied to a solenoid with a current sensor;
    converting the current supplied to the solenoid into a digital signal with a counter coupled to a first comparator;
    detecting a peak within the digital signal with a peak detector;
    comparing the peak to the digital signal with a second comparator coupled to the peak detector;
    measuring a dip from the peak and measuring a trough with the second comparator;
    generating a fault when the peak and the trough indicate a smooth current ramp to the solenoid;
    receiving configurable parameters for processing the digital signal with a signal processor; and
    providing the configurable parameters to the counter, the second comparator, the signal processor, or a combination thereof with an interface.

6. The method of claim 5 further comprising:
    receiving a start/end threshold from the interface; and
    converting the current supplied to the solenoid into the digital signal only between the start/end threshold with the counter.

7. The method of claim 5 further comprising receiving a top and bottom search levels for narrowing a range of the current within which the peak, the dip, and the trough can be identified with the signal processor.

8. The method of claim 5 further comprising receiving, with the signal processor, a de-glitch timing eliminating portions of a cycle of the solenoid that are not indicative of electrically powered plunger motion.

9. The method of claim 5 further comprising:
    receiving a slope profile with the signal processor;
    comparing slopes before, during, and after the dip to the slope profile with the signal processor; and
    generating the fault based on a deviation from the slope profile with the signal processor.

10. A solenoid plunger movement detection system comprising:
    a solenoid;
    a current sensor, coupled to an input of the solenoid, the current sensor detects current supplied to the solenoid;
    a counter coupled to a first comparator, the counter converts the current supplied to the solenoid into a digital signal, the first comparator functions as a component within a current drive regulation loop ensuring a controlled amount of the current is supplied to the solenoid;
    a peak detector coupled to the counter, the peak detector detects a peak within the digital signal; and
    a second comparator coupled to the peak detector, the second comparator compares the peak with the digital signal and measures a dip from the peak and measures a trough, and the second comparator generates a fault based on the peak and the trough indicating a smooth current ramp to the solenoid.

11. The system of claim 10 wherein the second comparator includes a dip amplitude threshold, and the second comparator generates the fault based on a difference between the peak and the trough being smaller than the dip amplitude threshold.

12. The system of claim 10 further comprising a signal processor, the signal processor determines a difference between a previous measurement from the solenoid and a current measurement of the solenoid.

13. The system of claim 10 wherein the peak detector detects the peak from a back electromagnetic force generated by movement of a plunger.

14. The system of claim 10 further comprising:
    a signal processor coupled to the second comparator, the signal processor receives configurable parameters for processing the digital signal; and
    an interface providing the configurable parameters to the counter, the second comparator, the signal processor, or a combination thereof.

15. The system of claim 14 wherein the counter receives a start/end threshold from the interface, and converts the current supplied to the solenoid into the digital signal only between the start/end threshold.

16. The system of claim 14 wherein the signal processor receives a top and bottom search levels narrowing a range of the current within which the peak, the dip, and the trough can be identified.

17. The system of claim 14 wherein the signal processor receives a de-glitch timing eliminating portions of a cycle of the solenoid that are not indicative of electrically powered plunger motion.

18. The system of claim 14 wherein the signal processor receives a slope profile, the signal processor compares slopes before, during, and after the dip with the slope profile, and the signal processor generates the fault based on a deviation from the slope profile.

\* \* \* \* \*